United States Patent

Stankavich et al.

[11] Patent Number: 5,803,344
[45] Date of Patent: Sep. 8, 1998

[54] DUAL-SOLDER PROCESS FOR ENHANCING RELIABILITY OF THICK-FILM HYBRID CIRCUITS

[75] Inventors: Anthony John Stankavich; Dwadasi Hare Rama Sarma; Christine Ann Paszkiet; Marion Edmond Ellis, all of Kokomo, Ind.

[73] Assignee: Delco Electronics Corp., Kokomo, Ind.

[21] Appl. No.: 709,886

[22] Filed: Sep. 9, 1996

[51] Int. Cl.$^6$ ............... B23K 31/02; B23K 35/26
[52] U.S. Cl. ............ 228/180.22; 228/187; 228/226; 228/233.2
[58] Field of Search ................... 228/187, 226, 228/233.2, 180.22

[56] References Cited

U.S. PATENT DOCUMENTS

| | | | |
|---|---|---|---|
| 3,381,081 | 4/1968 | Schalliol | 174/68.5 |
| 3,392,442 | 7/1968 | Napier et al. | 29/628 |
| 3,621,564 | 11/1971 | Tanaka et al. | 228/187 |
| 4,739,917 | 4/1988 | Baker | 228/123 |
| 5,361,966 | 11/1994 | Kanbe et al. | 228/123.1 |
| 5,540,379 | 7/1996 | Kazem-Goudarzi et al. | 228/233.2 |
| 5,634,268 | 6/1997 | Dalal et al. | 228/180.22 |
| 5,655,703 | 8/1997 | Jimarez et al. | 228/187 |

FOREIGN PATENT DOCUMENTS 02018989  1/1990  Japan.

OTHER PUBLICATIONS

"Reflow Solder Joint With Extended Height," *IBM Tech. Discl. Bull.*, vol. 28, No. 7, Dec. 1985, p. 2871.

*Primary Examiner*—Patrick Ryan
*Assistant Examiner*—Jeffrey T. Knapp
*Attorney, Agent, or Firm*—Mark A. Navarre

[57] ABSTRACT

A high temperature thick-film hybrid circuit is characterized by a surface-mount circuit component that is electrically interconnected with a conductor. The surface-mount circuit component of the thick-film hybrid circuit is bonded to the conductor with a soldering technique employing dual-solder layers. The dual-solder layers enable component attachment to the conductor at a temperature below the maximum processing temperature of the component, while forming a solder joint that exhibits suitable adhesion properties at temperatures in excess of 165° C. The dual-solder layers can be chosen to inhibit tin diffusion from the solder, silver leaching from the conductor, and the formation of a brittle intermetallic at the solder-conductor interface.

16 Claims, 2 Drawing Sheets

DUAL-SOLDER PROCESS FOR ENHANCING RELIABILITY OF THICK-FILM HYBRID CIRCUITS

The present invention generally relates to hybrid circuits in which circuit components are electrically interconnected to conductors with solder. More particularly, this invention relates to thick-film hybrid circuits having circuit components mounted to conductors with a dual-solder process that enhances the high temperature performance of such circuits.

BACKGROUND OF THE INVENTION

Where high temperature performance has been required in demanding applications of the type found in the automotive industry, thick-film hybrid circuits have often had the construction shown in FIG. 1, in which a conductor 14 is formed on an alumina substrate 12 and a surface-mount circuit component 10 is electrically and mechanically connected directly to the conductor 14 with a suitable solder or adhesive 16. For flip-chip applications, prior art thick-film hybrid circuits have had the construction shown in FIG. 3, in which a conductor trace 114 is formed on an alumina substrate 112, and a flip-chip circuit component 110 is electrically and mechanically connected directly to the conductor 114 with suitable solder bumps or adhesive bumps 116. The alloys for the solder 16 and bumps 116 typically contain tin, while the thick-film conductors and traces 14 and 114 are typically silver-based alloys, such as silver or silver-palladium.

Solder joint reliability depends on several factors, such as thermal mismatches in the materials used, diffusion of tin from tin-based solders, leaching of silver from the conductor by the solder, and the formation of a brittle intermetallic region at the conductor-solder interface. While leaching generally occurs during reflow, diffusion and formation of the intermetallic occurs during service when a hybrid circuit is subjected to high temperatures for an extended period. In addition, the intermetallic region is prone to fracturing during in-service thermal cycling due to the differing coefficients of thermal expansion of the intermetallic, conductor and solder materials, which induces significant stresses at the interfaces between these materials. Solders that exhibit high solderability, such as those with a relatively high tin content, e.g., 60Sn-40Pb solders, tend to promote tin diffusion, silver leaching, and the formation of the intermetallic region at the conductor-solder interface with silver-based conductors. In many applications, the growth of the intermetallic region is limited by the relatively low service temperature of the hybrid circuit. However, where relatively high temperatures are encountered over extended periods of time, the size of the intermetallic region increases significantly, which subsequently reduces the service life of the hybrid circuit.

One solution suggested by the prior art is to use solders that contain low percentages of tin. Although this solution results in minimizing tin diffusion, silver leaching and the subsequent formation of the intermetallic region, such solders have relatively high reflow temperatures that can exceed the temperature capability of a circuit component. For example, 10Sn-90Pb solders have a reflow temperature of about 350° C., a temperature at which thermal damage will occur with many circuit components, such as tantalum capacitors whose maximum processing temperature is generally less than 270° C. Therefore, while the use of low-tin solders can enhance the reliability of a hybrid electronic circuit, their use is significantly limited by their high reflow temperatures.

Accordingly, it would be desirable if the reliability of a hybrid circuit for high temperature applications could be improved by reducing the occurrence of tin diffusion, conductor leaching and intermetallic formation between circuit components and the conductors to which they are soldered, while entailing processing temperatures that do not exceed the capability of the circuit components of the hybrid circuit. It would also be desirable if the above could be attained with processing techniques that are commonly employed in the industry.

SUMMARY OF THE INVENTION

It is an object of this invention to provide a thick-film hybrid circuit in which a circuit component is electrically and physically connected to a conductor using a soldering technique that exhibits enhanced reliability at elevated temperatures.

It is another object of this invention that the soldering technique entails the use of dual-solder layers.

It is a further object of this invention that a first solder layer of the dual-solder layers is characterized by a relatively low tin content, such that the solder layer has a low propensity for tin diffusion, conductor leaching and the formation of an intermetallic with the conductor.

It is still a further object of this invention that the second solder layer is characterized by a higher tin content and a lower reflow temperature relative to the first solder, and serves to bond the circuit component to the first solder and the circuit component.

It is still another object of this invention that use of the dual solder technique is compatible with circuit components having maximum processing temperatures of less than 270° C.

It is yet another object of this invention that the dual solder technique does not significantly complicate processing of the hybrid circuit.

In accordance with a preferred embodiment of this invention, these and other objects and advantages are accomplished as follows.

According to the present invention, there is provided a thick-film hybrid circuit characterized by a circuit component that is electrically and mechanically interconnected to a conductor. The circuit component is bonded to the conductor through a novel soldering technique that employs dual solder alloys, which cooperate to increase the reliability of the hybrid circuit while operating at elevated temperatures, such as 165° C. or more.

In accordance with this invention, the circuit component is attached to the conductor by a solder joint composed of a first solder layer overlaying the conductor to which the circuit component is electrically connected, and a second solder layer between the first solder layer and the circuit component. The first and second solder layers have different compositions, each containing tin, but with the first solder layer having a lower tin content than the second solder layer. Furthermore, the second solder layer has a reflow temperature that is lower than that of the first, such that the first solder layer does not completely melt during reflow of the solder paste used to form the second solder layer. As a result, the combination of the low-tin first solder composition adjacent the conductor and the low-reflow second solder composition adjacent the circuit component enables the component to be attached at a reflow temperature below the component's temperature limit, while simultaneously yielding a solder joint that exhibits suitable adhesion properties at temperatures in excess of 165° C. The dual-solder layers also inhibit tin diffusion from the solder, silver leaching from the conductor, and the formation of a brittle intermetallic at the solder-conductor interface.

The above structure is produced by forming the conductor on a substrate in a conventional manner, and then printing and reflowing a solder paste corresponding to the first solder, thereby forming the first solder layer on an area of the conductor to which the circuit component is to be attached. A solder paste corresponding to the second solder is then printed on the first solder layer. In a preferred embodiment, the combined thickness of the first and second solder layers is about 0.3 millimeter or less. Another preferred aspect of the invention is that the second solder paste is printed to occupy an area of the first solder layer spaced apart from the perimeter of the first solder layer, such that the first solder layer prevents direct contact between the second solder layer and the conductor. Finally, the surface-mount circuit component is bonded to the conductor by reflowing the second solder paste at a temperature below the reflow temperature of the first solder layer and below the maximum tolerated processing temperature of the component, e.g., about 270° C.

Unexpectedly, solder joint durability tests have shown that a solder joint having the above configuration exhibits excellent fatigue properties at elevated temperatures when the total thickness of the solder layers is approximately 0.3 millimeter or less and the first solder layer is not significantly thinner than the second. For example, if the first solder layer has a thickness of approximately half that of the second solder layer, a dramatic reduction in fatigue life properties occurs. Even more surprising is that a combined solder layer thickness of 0.1 millimeter or less yields a solder bond that exhibits the greatest improvement in fatigue life. Finally, the adhesion strength of the resulting solder joint is surprisingly superior to that of the first and second solder alloys at temperatures of up to about 220° C.

From the above, one skilled in the art can appreciate that the solder bond configuration of this invention is applicable to a variety of component attachment applications, such as surface-mount components and flip-chips, and provides a solution to the problem of low reliability bonds between conductors and the circuit components of a hybrid circuit subjected to a high temperature environment. The higher-tin composition of the second solder layer (adjacent to the circuit component) enables a circuit component to be bonded to a conductor at a temperature below the maximum processing temperature of the component, e.g., approximately 270° C., while the lower-tin composition of the first solder layer (adjacent the conductor) promotes the reliability of the conductor-solder bond by reducing the tendency for tin diffusion, conductor leaching and the formation of a brittle intermetallic. Finally, the novel dual-solder of this invention can be readily implemented using presently-available processing methods, thereby enabling thick-film hybrid circuits to be mass produced for use in such industries as the automotive industry.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 2A:
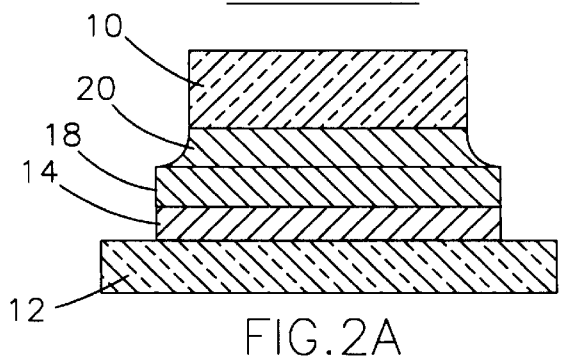
FIGS. 2A and 2B show, in cross-section, a thick-film hybrid circuit having a surface-mount circuit component solder bonded to a thick-film conductor with a dual-layer solder joint in accordance with two embodiments of this invention.
Figure 2B:
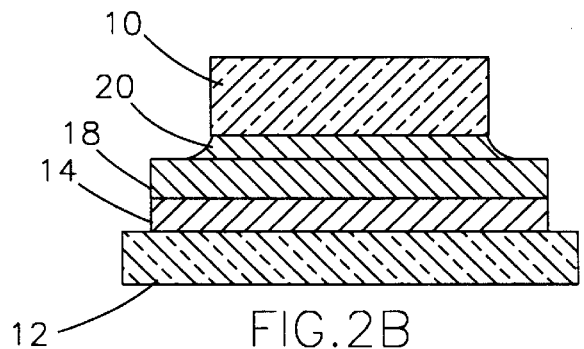
Figure 3:
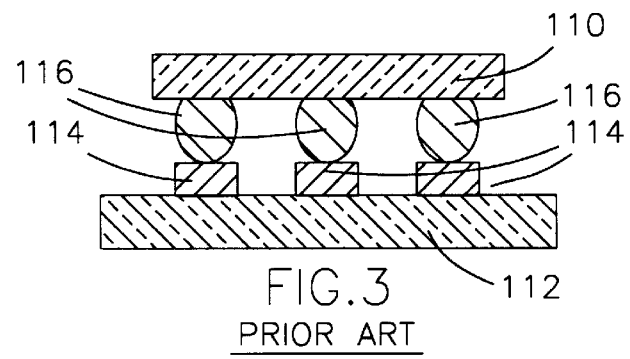
FIG. 3 shows, in cross-section, a thick-film hybrid circuit having a flip-chip circuit component solder bonded to conductor traces in accordance with the prior art.

Portrayed in FIGS. 2A and 2B are thick-film hybrid circuits incorporating dual-solder joints in accordance with this invention. In each of these Figures, the thick-film hybrid circuit is characterized by a silver-based conductor 14 formed on a suitable dielectric substrate 12. A surface-mount circuit component 10 is electrically and mechanically interconnected to the conductor 14 with a dual-solder joint composed of first and second solder layers 18 and 20, respectively. The dual-solder joint of this invention enables the attachment of the component 10 to the conductor 14 using a reflow temperature below about 270° C., yet is characterized by high temperature strength and fatigue resistance at temperatures in excess of 165° C., and up to at least 220° C. Preferably, the first and second solder layers 18 and 20 are low and high-tin solder compositions, respectively, with the lower-tin composition contacting the conductor 14 in order to reduce the tendency for tin diffusion into the conductor 14, silver leaching from the conductor 14, and the formation of a brittle intermetallic between the conductor 14 and the dual-solder joint.

As shown in FIG. 2A, the first and second solder layers 18 and 20 are roughly equal in thickness. In contrast, and for reasons discussed below, FIG. 2B illustrates the thickness of the second solder layer 20 is being less than that of the first solder layer 18. Formation of the dual-solder joints shown in FIGS. 2A and 2B generally entails the process of depositing a solder paste composition corresponding to the first solder layer 18 over an area of the conductor 14, and then reflowing the solder paste to form the first solder layer 18. According to this invention, the composition of the first solder layer 18 can have a reflow temperature that exceeds the maximum processing temperature (e.g., about 270° C.) of the component 10 to be attached to promote the high temperature mechanical properties of the solder bond.

A second solder paste corresponding to the second solder layer 20 is then printed on the first solder layer 18. As shown in FIG. 2A, the second solder layer 20 may completely cover the first solder layer 18 after reflow, such that the perimeter of the second solder layer 20 is superimposed with the perimeter of the first solder layer 18. In accordance with a preferred embodiment of this invention, FIG. 2B shows the second solder layer 20 as covering only a limited portion of the first solder layer 18 such that, after reflow, the perimeter of the second solder layer 20 is spaced apart from the perimeter of the first solder layer 18. In accordance with the latter embodiment, the second solder layer 20 is more reliably physically isolated from the conductor 14. As shown in FIGS. 2A and 2B, the paste for the second solder layer 20 can be printed to achieve a thickness for the second solder layer 20 of roughly equal to (FIG. 2A) or less than (FIG. 2B) the thickness of the first solder layer 18, with the total thickness of the first and second solder layers 18 and 20 being not more than about 0.3 millimeter, and preferably not more than about 0.1 millimeter. Thereafter, the surface-mount circuit component 10 is bonded to the second solder layer 20 by placing the surface-mount component 10 on the paste for the second solder layer 20, and then heating the thick-film hybrid circuit to a temperature sufficient to reflow the solder paste, yet less than the maximum processing temperature (270° C.) of the component 10 and less than the reflow temperature of the first solder layer 18.

Figure 4:
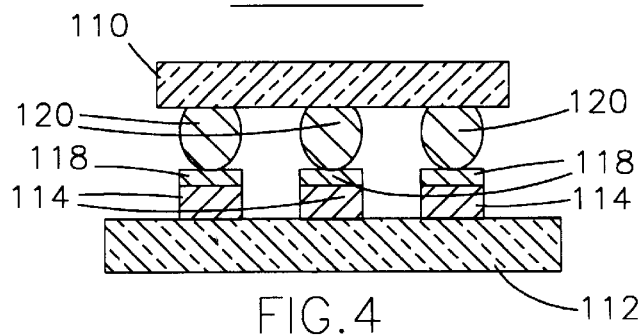
FIG. 4 shows, in cross-section, a thick-film hybrid circuit having a flip-chip circuit component solder bonded to conductor traces with a dual-layer solder joint in accordance with this invention.

One skilled in the art can appreciate that the above dual-solder bond configuration can also be employed to attach other circuit components to thick-film hybrid circuits, such as the flip chip 110 shown in FIG. 4. For such an application, the flip-chip 110 is attached to silver-based conductor traces 114 with solder pads 118 deposited on the traces 114 and solder bumps 120 formed on the flip-chip 110. As with the surface-mount circuit component 10 of FIGS. 2A and 2B, the application of the dual-solder joint of this invention entails the solder pads 118 being formed of a high-temperature, low-tin solder composition whose reflow temperature may exceed the maximum temperature capability for the circuit components of the hybrid circuit, while the solder bumps 120 are formed from a lower-temperature, high-tin solder composition whose reflow temperature is less than the maximum temperature capability for the circuit components. The solder pads 118 are printed and reflowed on the conductors 114, while the solder bumps 120 are conventionally formed on the flip-chip 110 by any suitable technique. Afterwards, the flip-chip 110 is registered with the traces 114 such that the solder bumps 120 register with the solder pads 118 as shown, and the entire thick-film hybrid circuit is heated to a temperature sufficient to reflow the solder bumps 120 yet less than the maximum temperature (e.g., about 270° C.) permitted for the components of the circuit. Again, the solder pads 118 and solder bumps 120 are printed to achieve a combined thickness of not more than about 0.3 millimeter.

The mechanical properties of the dual-solder technique of this invention were determined through experimentations with several different commercially-available solder compositions. The experiments were performed specifically with the intent of overcoming the problems concerning fabrication of high-temperature thick-film hybrid circuits that include circuit components with a maximum temperature capability of 270° C. The substrate employed throughout testing was alumina, which is a known substrate material for hybrid circuits. Conductors were formed from a thick-film ink composition available from E. I. DuPont de Nemours and Company, Inc., of Wilmington, Del., under the product designation 7484. The 7484 composition is based on a silver-palladium alloy, and is susceptible to leaching by a tin-based solder composition, though less so than alloys that do not contain palladium.

The solder pastes employed during the course of the testing were 10Sn-90Pb, 60Sn-40Pb, and 96.5Sn-3.5Ag alloys, with the 60Sn-40Pb solder alloy being nearer the eutectic point and therefore having a lower solidus point than the 10Sn-90Pb solder alloy. The 60Sn-40Pb solder was chosen as a control on the basis of its desirable low reflow temperature (about 235° C.) and its traditional use in the industry. Notably, the 60Sn-40Pb solder is unacceptable for use in high temperature applications due to a low solidus temperature of 183° C. The 10Sn-90Pb solder was chosen for its lower tin content, corresponding to a higher solidus temperature and a reduced tendency for tin diffusion. While the 10Sn-90Pb solder generally has better mechanical properties than the 60Sn-40Pb solder, its use in electronic circuits has been severely limited by its high reflow temperature of approximately 350° C., which exceeds the typical maximum reflow temperature of about 270° C. for attachment of a circuit component to a hybrid circuit without incurring thermal damage to circuit components of the circuit. The 96.5Sn-3.5Ag was chosen on the basis of its relatively low reflow temperature of about 260° C. However, as with the 60Sn-40Pb solder, it also is expected to have a high propensity for tin diffusion into silver-based conductors, such as the 7484 conductor composition tested.

Figure 1:
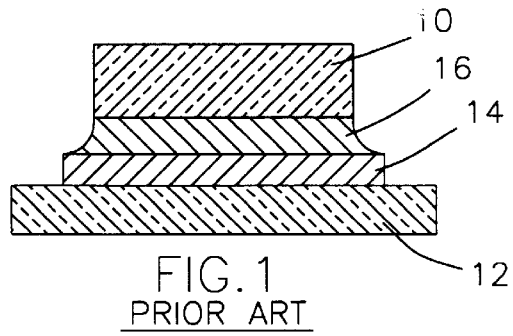
FIG. 1 shows, in cross-section, a thick-film hybrid circuit having a surface-mount circuit component solder bonded to a thick-film conductor in accordance with the prior art.

In accordance with this invention, 7484 conductors were printed and fired on the alumina substrate in a conventional manner. Solder pastes for the 10Sn-90Pb, 96.5Sn-3.5Ag and 60Sn-40Pb solder alloys were then printed and fired to form single-layer solder pads of the type shown in FIG. 1 or dual-layer solder pads as shown in FIG. 2A. All test specimens were reflowed to adhere an 80-mil (about two-millimeter) square laser weld pad to the substrate. The thicknesses of the single-layer solder joints were approximately 0.2 millimeter. For the dual-solder configuration, the 10Sn-90Pb solder alloy was printed as solder layer 18 of FIG. 2A, and the 96.5Sn-3.5Ag solder alloy was printed as the second solder layer 20. In addition, the dual-solder approach of this invention was evaluated on the basis of relative thicknesses of the 10Sn-90Pb and 96.5Sn-3.5Ag solder layers in order to determine the effect, if any, that solder layer thickness may have on the mechanical properties of the resulting solder joint. The compositions and thicknesses of the dual solder specimens were as follows in Table I.

TABLE I

| Specimen | 1st Solder Layer (10Sn—90Pb) | 2nd Solder Layer (96.5Sn—3.5Ag) | Total Thickness |
|---|---|---|---|
| A | 0.05 mm | 0.05 mm | 0.10 mm |
| B | 0.05 mm | 0.15 mm | 0.20 mm |
| C | 0.20 mm | 0.05 mm | 0.25 mm |
| D | 0.15 mm | 0.15 mm | 0.30 mm |

Table II below summarizes the results of the prior art single solders tested. The reported results provided a baseline for comparison for the results from the dual-solder approach, which are summarized in Table III below. Both tables contain the results (in Newtons) of adhesion tests conducted at room temperature, conducted after aging the assemblies at about 170° C. for a period of about 1000 hours, and conducted at about 220° C. Tables II and III also summarize the results of thermal cycle fatigue tests conducted between −50° C. and 175° C., with rate of failure in parts per million (ppm) being reported after 500 and 1000 cycles.

TABLE II

| | SOLDER COMPOSITION | | |
|---|---|---|---|
| Test | 10Sn—90Pb | 96.5Sn—3.5Ag | 60Sn—40Pb |
| Room Temperature Adhesion (N) | 93.4 | 153.5 | 156.1 |
| 1000-hour aging | 79.2 | 153.9 | 139.2 |

TABLE II-continued

SOLDER COMPOSITION

| Test | 10Sn—90Pb | 96.5Sn—3.5Ag | 60Sn—40Pb |
|---|---|---|---|
| at 170° C. (N) | | | |
| 220° C. Hot Test Adhesion (N) | 46.7 | 0 | 0 |
| 500 Temperature Cycles: Fatigue Failures (ppm) | 0 | 0 | 17,000 |
| 1000 Temperature Cycles: Fatigue Failures (ppm) | 0 | 67,000 | 67,000 |

As expected, the 10Sn-90Pb specimens exhibited adequate adhesion at both room temperature and at the elevated temperatures tested, and all survived the fatigue cycle tests, evidencing that the formation of a brittle intermetallic was limited by the lower level of tin in the solder. In contrast, the 96.5Sn-3.5Ag specimens demonstrated excellent adhesion at room temperature and 170° C., but had no adhesion strength at 220° C. (corresponding to the melting point of the solder), and exhibited a moderate failure rate after 1000 cycles of the thermal cycle fatigue test. The latter result would be expected due to the higher tin diffusion potential of this solder composition, leading to growth of the brittle intermetallic at the solder-conductor interface. Finally, the 60Sn-40Pb specimens exhibited similar test results as the 96.5Sn-3.5Ag samples, though some failures occurred after only 500 cycles into the thermal cycle fatigue test.

TABLE III

DUAL SOLDER COMPOSITIONS (96.5Sn—3.5Ag/10Sn—90Pb)

| Solder Specimen | A | B | C | D |
|---|---|---|---|---|
| Room Temp. Adhesion (N) | 113.4 | 163.7 | 107.6 | 141.0 |
| 1000-hr. aging at 170° C. (N) | 92.5 | 135.2 | 81.8 | 118.8 |
| 220° C. Hot Test Adhesion (N) | 12.9 | 39.6 | 30.2 | 41.8 |
| 500 Temp. Cycles Fatigue Failures (ppm) | 0 | 100,000 | 0 | 0 |
| 1000 Temp. Cycle Fatigue Failures (ppm) | 0 | 350,000 | 17,000 | 17,000 |

All of the dual-solder specimens had a final reflow temperature of below 270° C. as a result of the second solder layer being formed by the 96.5Sn-3.5Ag alloy. Surprisingly, each of the dual-solder specimens also exhibited better adhesion strength at 220° C. as compared to the 96.5Sn-3.5Ag single-layer specimens, even though the solder layers directly adhered to the weld pads were the same 96.5Sn-3.5Ag alloy. Finally, specimens A, C and D exhibited significantly better thermal fatigue properties over the single-layer specimens, as would be expected based on their first solder layers having a lower tin content, thereby reducing the potential for tin diffusion, silver leaching and formation of the brittle intermetallic. However, the A specimens, with a nominal total thickness of only 0.1 millimeter, unexpectedly exhibited the best overall results in terms of fatigue strength. In contrast, the B specimens, with a nominal total thickness of 0.2 millimeter and a 96.5Sn-3.5Ag layer thicker than the 10Sn-90Pb layer, unexpectedly exhibited the highest failure rate for the dual-solder specimens in fatigue, though exhibiting the highest initial room temperature adhesion strength. The results for the B specimens were particularly unexpected in view of the C specimens, whose total solder joint thicknesses were about 0.25 millimeter (and therefore roughly equal to the B specimens), but whose 96.5Sn-3.5Ag layer was thinner than the 10Sn-90Pb layer. Finally, adhesion strengths of the C and D specimens compared favorably to the A specimens, though results of the thermal cycle fatigue tests were not as exceptional.

From the above, an important aspect of this invention was realized through a comparison of the dual-solder specimens. Specifically, thinner solder joints performed better, but apparently on the condition that the thickness of the high-tin solder composition (e.g., 96.5Sn-3.5Ag) did not exceed, e.g., was roughly half, that of the lower-tin solder composition (e.g., 10Sn-90Pb). Reversing the relative thicknesses of these solder layers yielded entirely different results, as can be seen by comparing the thermal cycle fatigue results of specimens B and C. These results were unexpected and are not readily explainable.

Figure 5:
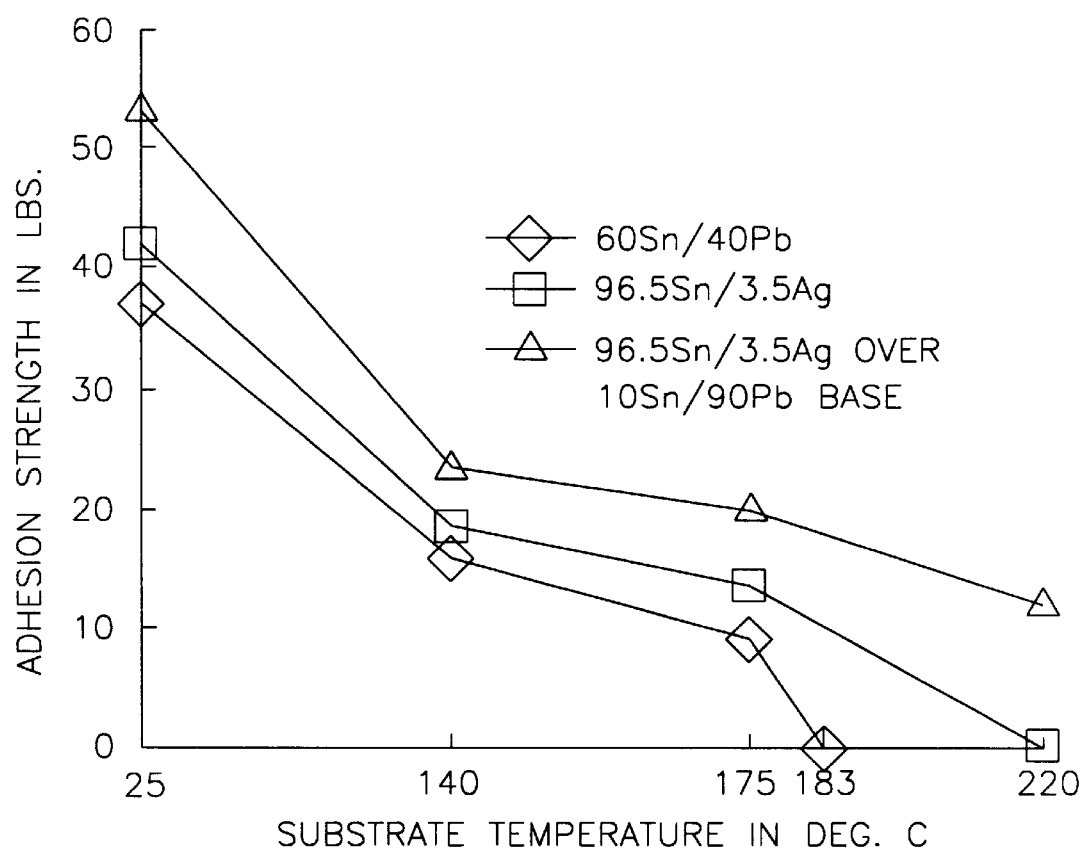
FIG. 5 graphically compares the results of adhesion tests performed on dual-layer solder joints in accordance with this invention and single-layer solder joints in accordance with the prior art.

Finally, a fundamental advantage of the present invention is that it enables circuit components to be reflow soldered to their conductors at temperatures well below the maximum temperature capability for the components of their hybrid circuits, yet yields solder joints that exhibit suitable adhesion strength at elevated temperatures, as evidenced by the 170° C. and 220° C. adhesion tests. These results were further confirmed by performing additional adhesion tests reported in FIG. 5. These tests consisted of "pushtests" during which a force was applied (until failure) to soldered devices in a direction parallel to the substrate surface to which the devices were solder performed. As can be seen, dual-solder specimens of 96.5Sn-3.5Ag alloy over 10Sn-90Pb alloy exhibited better adhesion strengths than single-layer specimens of the 96.5Sn-3.5Ag alloy when evaluated over temperatures ranging from room temperature (about 25° C.) to 220° C. These results parallel that shown in Table III, evidencing the superiority of the dual-solder approach of this invention, even where the same solder alloy (here, the 96.5Sn-3.5Ag alloy) is used to directly adhere the component to an underlying structure.

Finally, the above-noted advantages are achieved with the use of otherwise conventional processing techniques for thick-film hybrid circuits. As a result, this invention can be readily implemented to mass produce hybrid circuits for use in such industries as the automotive industry.

While our invention has been described in terms of a preferred embodiment, other forms could be adopted by one skilled in the art. For example, solder alloy compositions other than those specifically tested could be employed, solder joints composed of three or more solder layers could be employed, and multiple layers of solder could be applied by other methods or combinations of methods, such as dipping. Accordingly, the scope of our invention is to be limited only by the following claims.

The embodiments of the invention in which an exclusive property or privilege is claimed are defined as follows:

1. A method for mounting a circuit component to a thick-film hybrid circuit, the method comprising the steps of:
    forming a conductor on a substrate;
    printing a first solder paste on the conductor;
    heating the first solder paste to form a first solder layer having a reflow temperature of greater than about 270° C.;
    printing a second solder paste on the first solder layer so that the second solder paste is physically isolated from the conductor by the first solder layer; and heating the second solder paste to a temperature of less than 270° C. so as to electrically and mechanically interconnect a circuit component to the conductor, the second solder paste yielding a second solder layer having a tin content that is higher than the first solder layer, the first and second solder layers having a combined thickness of not greater than about 0.3 millimeter, the second solder layer having a thickness approximately equal to or less than the first solder layer.

2. A method as recited in claim 1, wherein the first solder layer is predominantly lead and the second solder layer is predominantly tin.

3. A method as recited in claim 1, wherein the first solder layer has a reflow temperature of about 350° C.

4. A method as recited in claim 1, wherein the second solder layer has a reflow temperature of about 260° C.

5. A method as recited in claim 1, wherein the first solder layer contains about 10 weight percent tin and about 90 weight percent lead.

6. A method as recited in claim 1, wherein the second solder layer contains about 96.5 weight percent tin and about 3.5 weight percent silver.

7. A method as recited in claim 1, wherein the first and second solder layers have a combined thickness of about 0.1 millimeter.

8. A method as recited in claim 1, wherein the first and second solder layers have a combined thickness of not greater than about 0.25 millimeter and the second solder layer has a thickness of less than that of the first solder layer.

9. A method for mounting a surface-mount component to a thick-film hybrid circuit, the method comprising the steps of:

forming a silver-based conductor on a substrate;

printing a first solder paste on the conductor;

heating the first solder paste to form a first solder layer of a first solder alloy comprising about 10 weight percent tin and having a reflow temperature of greater than about 270° C.;

printing a second solder paste on the first solder layer so that the second solder paste is physically isolated from the conductor by the first solder layer;

electrically and mechanically interconnecting a surface-mount circuit component to the conductor by heating the second solder paste to a temperature of less than 270° C., the second solder paste yielding a second solder layer of a second solder alloy having a tin content higher than the first solder alloy, the first and second solder layers forming a solder joint having a combined thickness of less than about 0.3 millimeter, the second solder layer having a thickness approximately equal to or less than the first solder layer, the second solder layer occupying an area of the first solder layer that is spaced apart from the edge of the first solder layer, the solder joint exhibiting an adhesion strength in excess of the first and second solder alloys at temperatures of up to about 220° C.

10. A method as recited in claim 9, wherein the first solder alloy is a tin-lead alloy and the second solder alloy is a tin-silver alloy.

11. A method as recited in claim 9, wherein the first solder alloy has a reflow temperature of about 350° C.

12. A method as recited in claim 9, wherein the second solder alloy has a reflow temperature of about 260° C.

13. A method as recited in claim 9, wherein the first solder alloy contains about 10 weight percent tin and about 90 weight percent lead.

14. A method as recited in claim 9, wherein the second solder alloy contains about 96.5 weight percent tin and about 3.5 weight percent silver.

15. A method as recited in claim 9, wherein the first and second solder layers have a combined thickness of about 0.1 millimeter and the first and second layers have approximately equal thicknesses.

16. A method as recited in claim 9, wherein the first and second solder layers have a combined thickness of not greater than about 0.25 millimeter and the second solder layer has a thickness of up to half that of the first solder layer.

* * * * *